United States Patent [19]

Rose et al.

[11] Patent Number: 4,714,833
[45] Date of Patent: Dec. 22, 1987

[54] ARRANGEMENT FOR DETECTING SECONDARY AND/OR BACKSCATTER ELECTRONS IN AN ELECTRON BEAM APPARATUS

[75] Inventors: Harald Rose, Darmstadt; Joachim Zach, Nauheim; Burkhard Lischke, Munich, all of Fed. Rep. of Germany

[73] Assignee: Siemens Aktiengesellschaft, Berlin and Munich, Fed. Rep. of Germany

[21] Appl. No.: 895,310

[22] Filed: Aug. 11, 1986

[30] Foreign Application Priority Data

Sep. 13, 1985 [DE] Fed. Rep. of Germany ....... 3532781

[51] Int. Cl.$^4$ ......................................... H01J 37/244
[52] U.S. Cl. .................................. 250/397; 250/310; 250/396 ML
[58] Field of Search ......... 250/310, 397, 396, 396 ML

[56] References Cited

FOREIGN PATENT DOCUMENTS 58-35854  3/1983  Japan ................................. 250/310
WO85/04757 10/1985 World Int. Prop. O. .......... 250/310

OTHER PUBLICATIONS

H. P. Feuerbaum, "VLSI Testing Using the Electron Probe", *Scanning Electron Microscopy*, (1979/I), pp. 285–296.

*Primary Examiner*—Craig E. Church
*Assistant Examiner*—Jack I. Berman
*Attorney, Agent, or Firm*—Hill, Van Santen, Steadman & Simpson

[57] ABSTRACT

An electron beam apparatus has a primary beam directed onto a point of a specimen to generate emerging secondary electrons that proceed to a detector after traversing an electrical extraction field. The extraction field is provided between electrodes arranged in a plane perpendicular to the optical axis of the electron beam device and a magnetic field is provided perpendicular to the electrical extraction field to compensate for the forces of the extraction field exerted on the primary beam yet to promote extraction of the secondary electrons.

14 Claims, 5 Drawing Figures

ARRANGEMENT FOR DETECTING SECONDARY AND/OR BACKSCATTER ELECTRONS IN AN ELECTRON BEAM APPARATUS

BACKGROUND OF THE INVENTION

1. Field of the Invention

The present invention relates generally to an electron beam apparatus for focusing a primary beam on a specimen and, more particularly, to an arrangement for generating an electromagnetic field to promote extraction of secondary and/or backscatter electrons to a detector.

1. Description of the Prior Art

Electron beam devices are known having electrical extraction fields provided for secondary electrons. However, the known devices have a disadvantage in that the primary electron beam is influenced in its direction by the extraction field. This is particularly true when the primary beam is generated with a relatively low accelerating voltage of, for example, 1 kV.

An electron spectrometer is disclosed in *Scanning Electron Microscopy*, 1979/I, SEM, Inc., AMF O'Hare, Ill. 60606, USA, pp. 285–296.

SUMMARY OF THE PRESENT INVENTION

An object of the present invention is to extract secondary and/or backscatter electrons for detection in an electron beam apparatus without influencing the direction of the primary electron beam. This and other objects are achieved in an electron detector arrangement for producing an electrical field in a plane perpendicular to the primary beam optical axis and for producing a magnetic field perpendicular to the electrical field and in the same plane. The strength and direction of the magnetic field is such that it compensates for the force exerted on the primary beam by the electrical field, but the magnetic field exerts a force in addition to the electrical field force on the secondary and/or backscatter electrons to promote the extraction thereof.

An advantage obtained with the present invention is that even for low accelerating voltages of the primary beam, the direction of the primary beam is not noticeably influenced by the electrical field which has been provided for the extraction of the secondary electrons.

In a further embodiment of the present invention, four symmetrically arranged electrodes are provided in spaced quadrature about the optical axis of the primary beam. Four magnetic pole members are also provided, one between each two neighboring electrodes. The polarity of the magnetic pole members is such that the magnetic field generated is perpendicular to the electrical extraction field.

DESCRIPTION OF THE PREFERRED EMBODIMENTS

Figure 1:
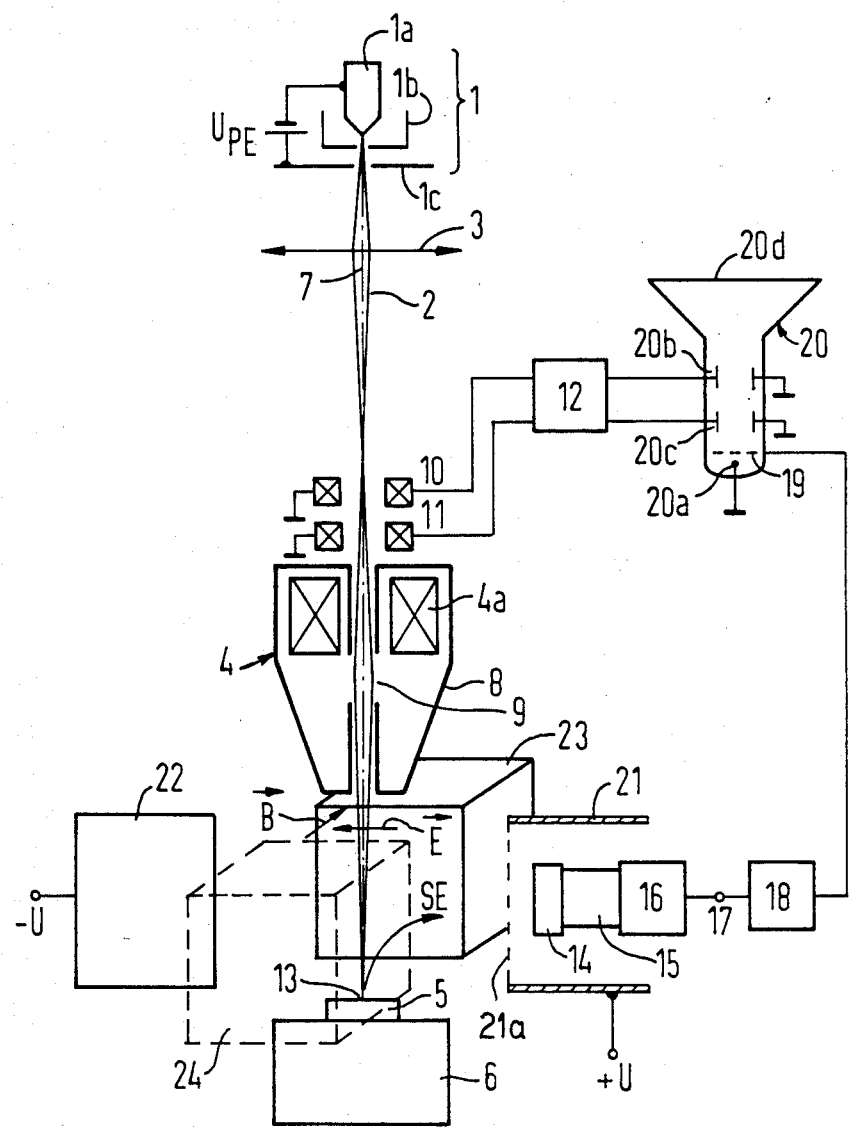
FIG. 1 is a diagram of a scanning electron microscope including an electron detection arrangement according to the principles of the present invention.

FIG. 1 is a schematic representation of a scanning electron microscope incorporating an electron detection arrangement of the present invention. Although the present device is shown for purposes of illustration for use on a scanning electron microscope, it is also within the scope of the present invention to utilize the detector apparatus in electron beam lithography and electron beam measuring technology.

In FIG. 1, an electron beam source indicated generally at 1 includes a cathode 1a, a Wehnelt electrode 1b and an anode 1c. An accelerating voltage $U_{PE}$ is applied between the cathode 1a and the anode 1c. An electron beam 2 produced by the source 1 emerges through an aperture formed in the anode 1c. The electron beam 2, which is referred to hereinafter as a primary electron beam, is focused by a condenser lens 3 as well as additional electron optical lenses provided in the beam path, only the last of which is shown as an objective lens 4. The electron beam 2 is focused onto a specimen 5, such as an integrated circuit, that is held on a specimen stage, or mount, 6. The electron optical system is provided about an axis 7.

The objective lens 4 of the scanning electron microscope includes a metallic cladding 8 which defines an air gap 9 through which a lens field, as generated by a coil 4a, acts on the primary electron beam 2. The primary beam 2 is deflected, or swept, over a region on the surface of the specimen 5 in line-by-line fashion by means of first and second deflecting coil systems 10 and 11 which are driven by a scan generator 12. The primary electron beam 2 is focused at a point 13 on the specimen 5, as a result of which secondary electrons SE and backscatter electrons emerge. The secondary electrons SE and backscatter electrons proceed through an electrical extraction field to a scintillator 14 which is connected by an optical conductor 15 to a photo-multiplier 16. An electrical signal is generated by the photo-multiplier 16 at an output 17 thereof, the electrical signal being characteristic of the point 13 on the specimen surface which has been targeted by the primary electron beam 2. The scintillator 14, optical conductor 15, photo-multiplier 16, and output 17 are also referred to jointly as a backscatter detector.

A signal processing device 18 receives the electrical signal from the output 17 and derives a control signal which is supplied to an intensity control 19 of a picture tube, or CRT, 20. The picture tube 20 includes a cathode 20a, a deflection system 20b and 20c for influencing an electron beam emanating from the cathode 20a, and a picture screen 20d. The deflection system 20b and 20c is driven by the scan generator 12 so that the electron beam on the picture screen 20d is deflected across the picture screen in a way corresponding to the deflection of the primary electron beam 2 over the surface of the specimen 5. Every image point on the picture screen 20d which corresponds to a scan point 13 on the specimen 5 is illuminated with a brightness corresponding to the electrical signal received from the specimen. An image of the specimen surface, thus, is formed on the picture screen 20d.

First and second electrodes 21 and 22 are disposed between the objective lens 4 and the specimen 5 in a plane perpendicular to the axis 7. The first electrode 21 is maintained at a voltage +U and the second electrode 22 is maintained at a voltage −U so that an electrical extraction field exists between the electrodes 21 and 22. The extraction field exerts a force toward the first electrode 21 on electrons within the field and is shown by a field strength vector $\overline{E}$.

First and second magnetic pole members 23 and 24 are also disposed in the plane of the electrodes 21 and 22. The magnetic pole members 23 and 24 are shown in the illustrated embodiments as having a cuboid shape, the magnetic pole member 24 lying in front of the plane of the drawing of FIG. 1 and being indicated with broken lines and the magnetic pole member 23 lying behind the plane of the drawing and being indicated with solid lines. The pole member 24 is a positive magnetic pole while the pole member 23 is a negative magnetic pole. A magnetic field exists between the magnetic pole members 23 and 24 and is indicated by a field strength vector $\overline{B}$ in the direction from pole 24 to pole 23. The magnetic vector $\overline{B}$ is perpendicular to the electrical field strength vector $\overline{E}$ generated by the electrodes 21 and 22 and directed from the first electrode 21 to the second electrode 22.

Referencing the quantitative measure of the electrical field strength as E and referencing the quantitative field strength of the magnetic field as B, the electrical field exerts a force q.E in the direction from electrode 22 toward electrode 21 on an electron of the primary electron beam 22 disposed in the proximity of the axis 7 and having an elemental charge q. Simultaneously, however, the magnetic field of the pole members 23 and 24 exerts a Lorentz force of q.v.B on this electron, where v is the velocity in the downward direction toward the specimen 5 of the electron. The Lorentz force acts in the direction from the electrode 21 toward the electrode 22. When the values E, B and v satisfy the equation v=E/B, then electrons in the primary beam 2 are not influenced by the extraction field. In other words, the force of the electrical extraction field balances the force of the magnetic field so that the electrons in the primary beam are not deflected from their paths proceeding roughly parallel to the axis 7.

Each secondary electron SE or backscatter electron that moves from the specimen 5 in an upward direction or which has some velocity component in the upward direction is also affected by a Lorentz force from the magnetic field. Since the velocity component is the opposite of that above, the resulting Lorentz force is also in the opposite direction and acts in the direction from electrode 22 toward electrode 21 so that the extraction event is promoted by the effects thereof.

The extracted secondary electrons SE proceed through a grating 21a in the electrode 21 to the scintillator 14. In addition to the secondary electrons SE, backscatter electrons, which are primary electrons reemerging at the scanned point 13, also proceed to the scintillator 14. An extremely effective extraction of the secondary electrons SE is, thus, achieved by the present invention in which appropriately dimensioned electric and magnetic dipole fields are crossed so that their combined effect does not noticeably influence the direction of the primary beam 2.

Figure 2:
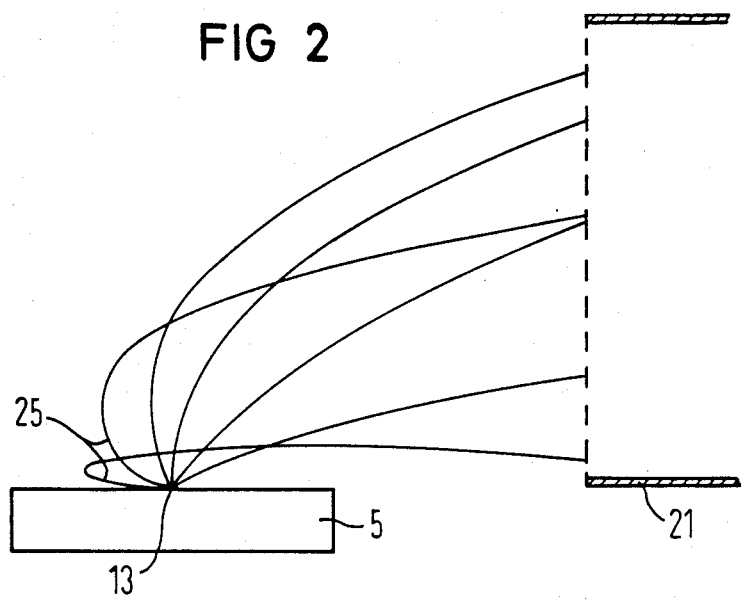
FIG. 2 is a diagram of the paths of various secondary electrons proceeding from a specimen to a detector as generated by the device of FIG. 1.

In FIG. 2, the paths of various secondary electrons emerging from the specimen 5 at the point 13 are shown. Each of these secondary electrons SE proceed in the direction toward the electrode 21, including the secondary electrons which initially have an exit path in the direction of the opposing electrode 22.

Figure 3:
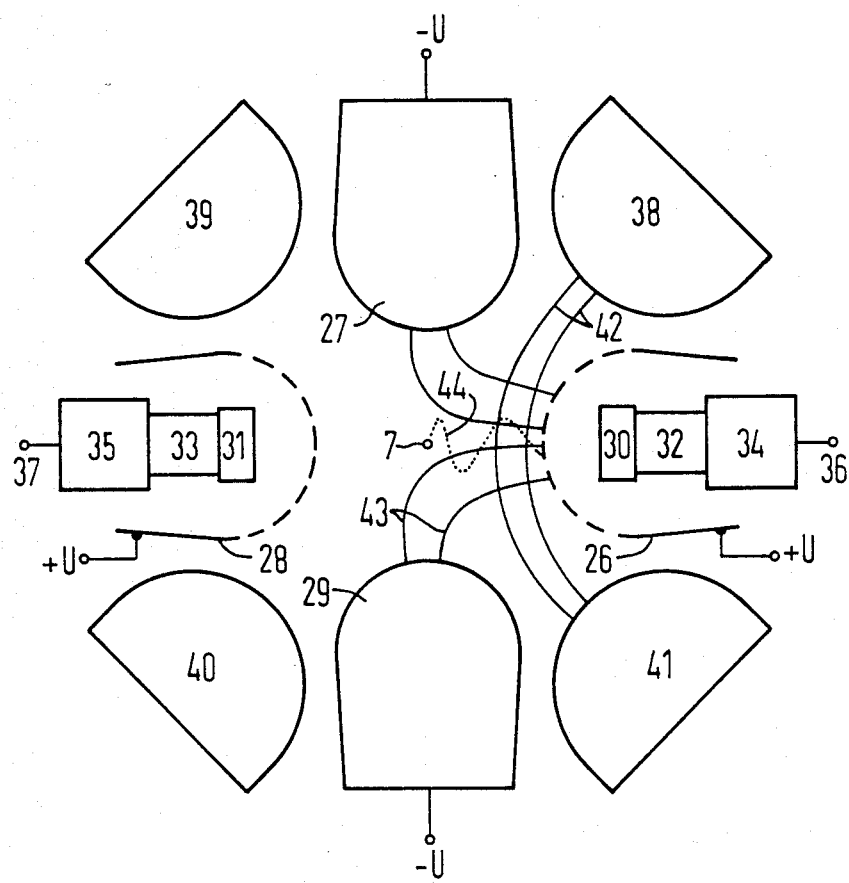
FIG. 3 is a plan view of a second embodiment of the apparatus of the present invention, particularly suitable for low acceleration voltages.

As shown in FIG. 3, another embodiment of the present invention replaces the magnetic and electric dipole arrangement shown in FIG. 1 with an electric quadripole and magnetic quadripole arrangement of electrodes and magnetic pole members, respectively, arranged in a single plane. From the plan view of FIG. 3, four electrodes 26, 27, 28, and 29 are shown arranged along the sides of an imaginary square whose center lies roughly at the electron-optical axis 7. The electrodes 26 and 28 are roughly symmetrical with respect to the axis 7 and are maintained at a voltage +U. The electrodes 27 and 29 are also symmetrical with respect to the axis 7 and are provided with a voltage −U.

An electrical extraction field exists between the electrodes 26 and 29 and between the electrodes 26 and 27 which transports, or extracts, electrons toward the electrode 26. An electrical extraction field also exists between the electrodes 28 and 27 and the electrodes 28 and 29 which transports electrons toward the electrode 28. The electrodes 26 and 28 are formed with lattice-shaped portions at the regions facing the optical axis 7 so that extracted electrons proceed through the lattice to scintillators 30 and 31 that are connected to respective photo-multipliers 34 and 35 by respective light conductors 32 and 33. The photo-multipliers 34 and 35 include respective outputs 36 and 37 which correspond to the output 17 of FIG. 1. The outputs 36 and 37 can either be supplied to the inputs of either an addition or a subtraction element (not shown) to produce a resulting electrical signal.

Four magnetic pole members 38, 39, 40, and 41 are also provided, each lying between respective neighboring electrodes 26, 27, 28, and 29. The magnetic pole members 38 and 40 are arranged approximately symmetrically with the optical axis 7 and are in the form of magnetic north poles. The magnetic pole members 39 and 40 are also symmetrical about the optical axis 7 and are magnetic south poles. A magnetic field indicated by field lines 42 exists between the magnetic pole members 38 and 41 and is perpendicular to the electrical extraction field of the electrode 26, as shown by field lines 43. A magnetic field also exists between the magnetic pole members 39 and 40 which is perpendicular to the extraction field for the electrode 28. The quadripole arrangement of FIG. 3, thus, provides perpendicular magnetic and electrical fields, just as in the dipole arrangement of FIG. 1.

In the illustrated embodiment of FIG. 3, the magnetic pole members 38, 39, 40, and 41 are disposed partially behind the electrodes 26, 27, 28, and 29 with respect to the optical axis 7. The pole members 38–41 can alternately be at an even greater distance from the axis 7 when the electrodes 26–29 are formed of a material having a permeability μ approximately equal to 1, such as, for example, brass. The electrodes 26–29 are preferably each at the same spacing from the axis 7, while the magnetic pole members 38–41 are likewise each at the same spacing from the axis 7. The spacing of the pole members 38–41 from the axis 7 can differ from the spacing of the electrodes 26–29 from the axis, although this is not required.

The field strengths of the electrical and magnetic fields of the quadrupole arrangement of FIG. 3 are selected such that their combined influence on the primary beam 2 is mutually compensated. As described above, electrons having an opposite velocity component to that of the primary beam 2 are very effectively extracted toward the electrodes 26 and 28 by the combined effects of the electrical and magnetic fields. The path of a secondary electron being extracted by the electrode 26 is shown at 44, having had an initial velocity component in the direction of the electrode 27.

For an arrangement as shown in FIG. 3, the chromatic and geometrical aberrations of higher order have only an insignificant effect on the primary beam 2 even for high topical resolutions of the specimen 5. The illustrated arrangement is therefore suitable particularly for use with electron beam apparatus having acceleration voltages $U_{PE}$ which are lower than 1 kV and having resolution limits of lower than 0.1 μm.

Figure 4:
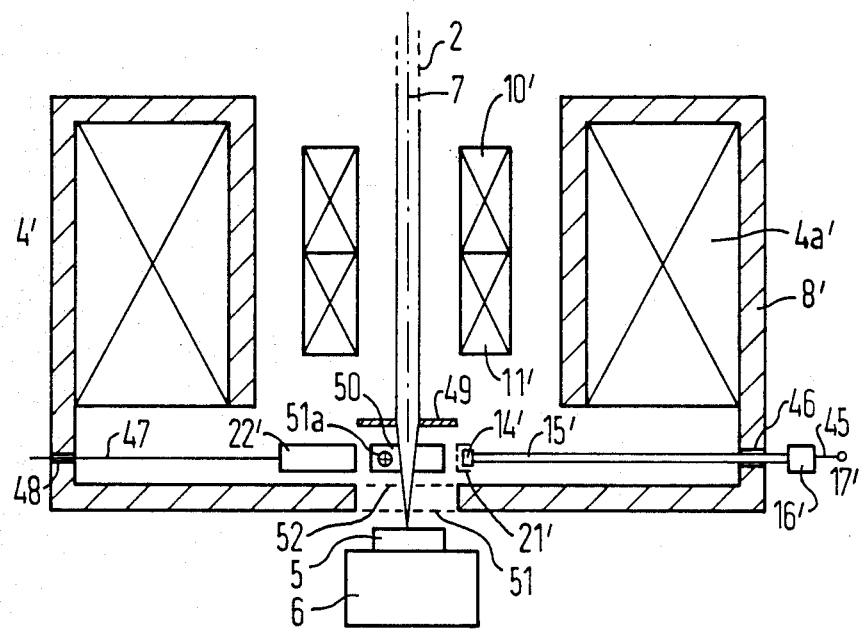
FIG. 4 is a vertical cross-section of a third embodiment of an electron detection apparatus of the present invention disposed within an objective lens of an electron beam apparatus.

Referring now to FIG. 4, another embodiment of the invention is shown wherein the working distance between a projection lens 4' and the specimen 5 is so small that the electric-magnetic detector field arrangement of FIG. 1 cannot be provided between these respective parts. The projection lens 4' has a winding 4a' that is encased by a metallic cladding 8' which in turn has an air gap so that a coil field can influence the primary beam 2. According to the present invention, electrodes 21' and 22' are provided in the air gap, with the electrode 21' being wired for a voltage +U and the electrode 22' being wired for voltage −U. A detector formed of a scintillator 14', a light conductor 15' and a photo-multiplier 16' is provided behind a lattice-shaped portion of the electrode 21'. The light conductor 15' extends out of the interior of the lens 4' through a bore 46 in the metallic cladding 8' where it is connected to the photomultiplier 16' at the exterior of the lens 4'. The photomultiplier 16' has an output line 45 which leads to an output terminal 17', similar to the output terminal described hereinabove. The electrode 22' is connected to a conductor line 47 wired to a voltage −U, wherein the conductor line 47 extends to a bore 48 in the cladding 8'.

An aperture diaphragm 49 is shown for the primary beam 2. Deflecting coils 10' and 11' are also preferably provided within the interior of the lens 4', and particularly in the region of the coil windings 4a'.

A magnetic field is generated perpendicular to the electrical extraction field existing between the electrodes 21' and 22'. The magnetic field is formed by a magnetic pole member 50, which is a negative magnetic pole, that lies behind the plane of the drawing. A further magnetic pole member, representing a positive magnetic pole, is located in front of the plane of the drawing and is not shown herein for purposes of simplicity. The magnetic field between the magnetic pole members is shown by a field strength vector 51a directed into the plane of the drawing. Due to the mutual compensation effects of the extraction electrical field existing between the electrodes 21' and 22' and the magnetic field 51a, the electrons of the primary beam 2 are not deflected even though the electrodes 21 and 22 and the pole members 50 are in the air gap of the cladding 8'. As already described above, the extraction of electrons, and in particular, secondary electrons, is promoted by the effects of the magnetic field.

When the illustrated detector is used in an electron spectrometer, spectrometer gratings 51 and 52 are provided in an opening, or a bore, of a lower horizontal portion of the metallic cladding 8'. When utilized in a retarding field spectrometer for extracting electrons, for example, the grating 51 is maintained at a voltage of +600 volts and the grating 52 is maintained at a voltage of −4 volts for filtering the electrons and the electrode 21' of the present detector is maintained at a voltage of 120 volts. A spectrometer of the type for use with the present invention is described in *Scanning Electron Microscopy*, 1979/I, SEM Inc., AMF O'Hare, Ill. 60606, USA, pp. 285–296, and in particular, FIG. 5. The electric and magnetic dipole field arrangement within the air gap of the metallic cladding 8' can be replaced by an electric and magnetic quadripole arrangement as shown in FIG. 3 in order to suppress chromatic and geometrical aberrations of higher orders.

Figure 5:
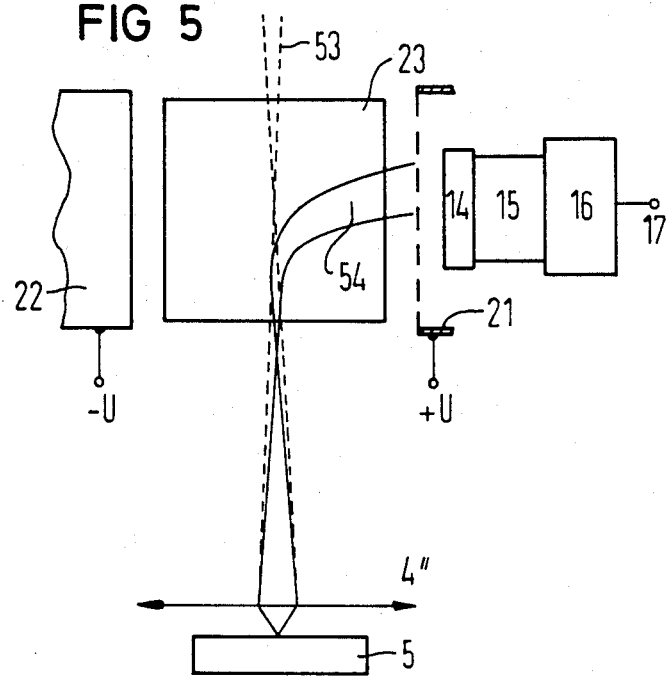
FIG. 5 is a further embodiment of the present invention disposed opposite an objective lens from a specimen.

FIG. 5 shows another embodiment of the present invention wherein an electric and magnetic dipole field is generated by electrodes 21 and 22 and magnetic pole members 23 and 24 (pole member 24 not being shown). A backscatter electron detector having a scintillator 14, a light conductor 15, and a photo-multiplier 16 with an output 17 is also provided. The elements of the detector and the electric and magnetic field generating parts are provided at the side of a projection lens 4" facing away from the specimen 5. In other words, the projection lens 4", which is in the form of an immersion lens, is between the specimen 5 and the detector and field generating elements. A primary beam is indicated by broken lines 53 extending along an optical axis. Secondary electrons 54 are accelerated by the immersion lens 4" and are extracted toward the electrode 21 by the dipole field. As in the other embodiments, it is possible to provide an electric and magnetic quadripole arrangement as shown in FIG. 3 in place of the dipole arrangement for extracting secondary electrons.

FIGS. 4 and 5 show only some of the elements necessary for a working model of the present invention, the excluded parts being substantially the same as shown in FIG. 1.

The present invention is particularly useful in an apparatus for electron beam lithography or an electron beam measuring technology or scanning electron microscopy, and in particular, the embodiment shown in FIG. 4 which guarantees small working distance between the specimen and the projection lens or, respectively, a short focal length of the projection lens and, thus, a resulting high topical resolution of the specimen surface even for extremely extended specimens. The present invention also guarantees faultless electron detection in such electron devices.

Although modifications and changes may be suggested by those skilled in the art, it is the intention of the inventors to embody within the patent warranted hereon all changes and modifications as reasonably and properly come within the scope of their contribution to the art.

I claim as my invention:

1. An arrangement for detecting secondary electrons and/or backscatter electrons resulting from a primary electron beam being focused substantially along an electron-optical axis onto a specimen, comprising:
    at least two electrodes disposed in a plane perpendicular to the electron-optical axis;
    means for generating an electrical extraction field between said at least two electrodes to extract the secondary electrons and/or backscatter electrons to at least one of said electrodes;
    at least one detector disposed directly behind and adjacent to one electrode to which the electrons are extracted;
    At least two magnetic pole members disposed in the plane of said at least two electrodes and generating a magnetic field substantially perpendicular to the electrical extraction field, the strength and direction of the magnetic field exerting a force on electrons in the primary beam to compensate a force exerted on the primary beam electrons by the electrical extraction field but the magnetic field exerting a force on the secondary electrons and/or backscatter electrons to promote extraction toward said detector.

2. An arrangement as claimed in claim 1, wherein four of said electrodes are disposed in a plane perpendicular to the electron-optical axis, said four electrodes being along the sides of a square having the center substantially on the electron-optical axis, two of said four electrodes being approximately symmetrical to said electron-optical axis and being at a first potential, another two of said four electrodes being at a second potential that is more negative than said first potential;

wherein the electrical extraction field extracts electrons at least toward a first of said two electrodes being at a first potential, said electrical extraction field being between neighboring ones of said four electrodes;

wherein one of said detectors is disposed behind each of said two electrodes at said first potential;

wherein four of said magnetic pole members are provided, each of said magnetic pole members being disposed between respective neighboring ones of said four electrodes; and wherein a magnetic field is present at least between two of said four magnetic pole members disposed on either side of said first electrode at said first potential, said magnetic field being substantially perpendicular to said electrical extraction field that extracts electrons toward said first electrode.

3. An arrangement as claimed in claim 2, wherein said four magnetic pole members are disposed at a greater distance from said electron-optical axis than said four electrodes.

4. An arrangement as claimed in claim 1, wherein said electrodes are of a material having a permeability of approximately 1.

5. An arrangement as claimed in claim 1, wherein at least one of said electrodes has a lattice-form portion and said detector is disposed behind said lattice-form portion of said electrode.

6. An arrangement as claimed in claim 1, wherein said at least one detector includes:
a scintillator,
a light conductor connected to said scintillator,
a photo-multiplier connected to said light conductor to receive light from said scintillator to produce an electrical signal at an output of said photo-multiplier.

7. An arrangement as claimed in claim 1, further comprising:
an objective lens for focusing the primary beam on a specimen, and
wherein said electrodes and said magnetic pole members are disposed between said objective lens and the specimen.

8. An arrangement as claimed in claim 1, further comprising:
a projection lens along the electron-optical axis, and
wherein said electrodes and said magnetic pole members are
disposed within said projection lens.

9. An arrangement as claimed in claim 8,
wherein said projection lens has a metallic cladding forming an air gap, and
wherein said electrodes and said magnetic pole members are disposed in the proximity of said air gap.

10. An arrangement as claimed in claim 9, wherein said detector includes:
a scintillator,
a photo-multiplier, and
a light conductor connecting said scintillator to said photo-multiplier, and
wherein said metallic cladding defines an opening through which said light conductor of said detector extends from the interior of said projection lens.

11. An arrangement as claimed in claim 9, wherein said metallic cladding defines a second opening, and further comprising:
an arrangement of spectrometer gratings at least in the proximity of said second opening.

12. An arrangement as claimed in claim 1, further comprising:
a projection lens in the form of an immersion lens disposed between the specimen and the plane of said electrodes and said magnetic pole members.

13. An electron detector for use in an electron beam apparatus having a primary electron beam substantially along an axis and focused on a specimen, comprising:
first and second electrodes arranged substantially symmetrical to the axis and in a plane perpendicular to the axis, said first and second electrodes being charged with substantially equal but opposite voltages whereby said voltages generate an extraction field for transporting electrons to said first electrode;
first and second magnetic pole members arranged substantially symmetrical to the axis and in the plane of said electrodes, said first and second magnetic pole members having opposite magnetic attractions and being arranged to form a magnetic field substantially perpendicular to said extraction field whereby said magnetic field exerts a force on electrons in said primary beam substantially equal to but opposite to the force exerted on electrons in said primary beam by said extraction field and exerts a force on electrons having an opposite velocity to said primary beam in the direction of the force of said extraction field; and
a detector disposed directly behind and adjacent to said first electrode for detecting extracted electrons.

14. An electron detector for use in an electron beam apparatus having a primary electron beam substantially along an axis and focused on a specimen, comprising:
four electrodes arranged symmetrically with the axis in a plane perpendicular to the axis, a first two of said electrodes being charged with a first voltage and opposite one another about the axis, a second two of said electrodes being charged with a voltage substantially equal to but opposite the first voltage whereby an extraction field is formed for transporting electrons to said first two electrodes,
four magnetic pole members arranged in the plane of said electrodes and symmetrical about the axis, a first two of said magnetic pole members having the same magnetic attraction and being opposite one another about the axis and a second two of said magnetic pole members having an opposite magnetic attraction whereby a magnetic field is formed substantially perpendicular to said extraction field; and
a detector disposed directly behind and adjacent to each of said two electrodes for detecting extracted electrons.

* * * * *